(12) United States Patent
Hara et al.

(10) Patent No.: US 9,673,332 B2
(45) Date of Patent: Jun. 6, 2017

(54) CIRCUIT SUBSTRATE MANUFACTURING METHOD

(71) Applicant: Sharp Kabushiki Kaisha, Osaka (JP)

(72) Inventors: Yoshihito Hara, Osaka (JP); Yukinobu Nakata, Osaka (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 0 days.

(21) Appl. No.: 15/163,946

(22) Filed: May 25, 2016

(65) Prior Publication Data

US 2016/0268442 A1  Sep. 15, 2016

Related U.S. Application Data

(62) Division of application No. 14/426,234, filed as application No. PCT/JP2013/073863 on Sep. 5, 2013, now abandoned.

(30) Foreign Application Priority Data

Sep. 12, 2012  (JP) .................................. 2012-200851

(51) Int. Cl.
*H01L 21/00* (2006.01)
*H01L 29/786* (2006.01)
(Continued)

(52) U.S. Cl.
CPC .. *H01L 29/78606* (2013.01); *H01L 21/02565* (2013.01); *H01L 21/441* (2013.01);
(Continued)

(58) Field of Classification Search
CPC ..... H01L 29/7869; H01L 29/24; H01L 29/45; H01L 29/669; H01L 21/441; H01L 21/465
(Continued)

(56) References Cited

U.S. PATENT DOCUMENTS 8,461,594 B2   6/2013  Morosawa et al.
2012/0199891 A1  8/2012  Suzuki et al.
(Continued)

FOREIGN PATENT DOCUMENTS

JP   2007-157916   *  6/2007
JP   2007-157916 A    6/2007
WO  2012/046658 A1    4/2012

*Primary Examiner* — Tan N Tran
(74) *Attorney, Agent, or Firm* — Chen Yoshimura LLP

(57) ABSTRACT

A method of manufacturing a circuit substrate comprising a semiconductor element disposed on a transparent substrate, includes: forming an island-shaped oxide semiconductor layer on the transparent substrate; forming a patterned etch-stop layer made of an insulating material so as to cover at least a center portion of the island-shaped oxide semiconductor layer; depositing a conductive layer over an entire surface of the transparent substrate including a region over the patterned etch-stop layer; forming a patterned resist on the conductive layer; and etching the conductive layer using the patterned resist as a mask to form a patterned conductive layer from the conductive layer, wherein the patterned conductive layer includes a source electrode, a source wiring line, and a drain electrode, and continuing to etch the island-shaped oxide semiconductor thereunder using the patterned conductive layer and the patterned etch-stop layer as a mask to form a cutout in the island-shaped oxide semiconductor layer.

5 Claims, 8 Drawing Sheets

(51) Int. Cl.
*H01L 21/02* (2006.01)
*H01L 21/441* (2006.01)
*H01L 21/465* (2006.01)
*H01L 21/4757* (2006.01)
*H01L 27/12* (2006.01)
*H01L 29/24* (2006.01)
*H01L 29/45* (2006.01)
*H01L 29/66* (2006.01)

(52) U.S. Cl.
CPC ...... *H01L 21/465* (2013.01); *H01L 21/47573* (2013.01); *H01L 27/127* (2013.01); *H01L 27/1225* (2013.01); *H01L 27/1259* (2013.01); *H01L 29/24* (2013.01); *H01L 29/45* (2013.01); *H01L 29/66969* (2013.01); *H01L 29/7869* (2013.01); *H01L 29/78696* (2013.01); *H01L 27/124* (2013.01)

(58) Field of Classification Search
USPC ............ 257/59, 72, 258, 432; 438/149, 438/FOR. 201
See application file for complete search history.

(56) References Cited

U.S. PATENT DOCUMENTS

| | | |
|---|---|---|
| 2013/0181217 A1 | 7/2013 | Hara et al. |
| 2014/0035478 A1 | 2/2014 | Kitakado et al. |

\* cited by examiner

CIRCUIT SUBSTRATE MANUFACTURING METHOD

TECHNICAL FIELD

The present invention relates to a circuit substrate, method of manufacturing thereof, and display device. More particularly, the present invention relates to a circuit substrate that can be suitably used in high resolution display devices and the like, and to a method of manufacturing thereof and a display device.

BACKGROUND ART

Circuit substrates have an electric circuit as a constituent element, and circuit substrates containing an element such as a thin film transistor (TFT), for example, are widely utilized as components of electronic devices such as liquid crystal display devices, electroluminescent display devices, and display devices using electrophoresis.

A circuit configuration of a TFT array substrate forming a portion of a TFT driven liquid crystal display panel is described below as an example. Normally, a TFT array substrate has a pixel circuit containing a structure in which the intersections of wires in an m×n matrix composed of scan lines being m rows and signal lines being n columns are provided with TFTs as switching elements. Note that drain electrode of a TFT is electrically connected to a pixel electrode. Also, peripheral circuits such as scan driver ICs (integrated circuits) and data driver ICs are electrically connected to gate wiring and source wiring extending from each TFT.

The circuits are affected by the performance of TFTs created on the TFT substrate. That is, circuits created on a TFT substrate are affected by whether the circuit is operable, whether the circuit will scale, whether the yield will increase, and the like due to the TFTs created on the circuit substrate, because the performance of the TFTs created on the TFT substrate differ depending on the material quality thereof. In conventional circuit substrates, a-Si (amorphous silicon) is largely employed due to being able to cheaply and easily form TFTs.

Meanwhile, there is disclosed below a method of manufacturing a semiconductor device in which an oxide semiconductor layer is formed instead of an amorphous silicon semiconductor layer (see Patent Document 1, for example).

RELATED ART DOCUMENT

Patent Document

Patent Document 1: WO 2012/046658

SUMMARY OF THE INVENTION

Problems to be Solved by the Invention

Instead of a-Si, there has been research into circuit substrates that have a semiconductor element with an oxide semiconductor (indium gallium zinc oxide, for example), which is advantageous due to having high mobility, and into a method of manufacturing thereof. The inventors have been conducting research that takes into account the reliability of using an etch-stop process (hereinafter also referred to as "ES process") in which an etch-stop layer is provided on at least a center portion of the oxide semiconductor.

There is demand for higher resolution in small-size liquid crystal panels. The total capacitance of the entirety of a liquid crystal panel declines when the resolution of the liquid crystal panel is high and the pixel electrodes are small. Meanwhile, the capacitance between a gate electrode and a drain electrode (Cgd capacitance) is substantially constant, thus causing the Cgd capacitance to occupy a larger portion of total capacitance. Note that Cgd capacitance is basically formed between a gate metal and a semiconductor layer/source metal via an insulating layer.

The Cgd capacitance of a liquid crystal panel using an ES process has a tendency to become larger compared to the Cgd capacitance of a liquid crystal panel using a back-channel-etch system (hereinafter, this type of liquid crystal panel may be referred to as a "CE structure liquid crystal panel"). For liquid crystal panels, an ES process is desired in which Cgd capacitance can be suitably reduced, thereby reducing the influence of Cgd capacitance on applied voltage, appropriately maintaining the set voltage, and resulting in favorable display performance of a display device provided with a circuit substrate, for example.

The present invention takes into consideration the above conditions, and an objective thereof is to provide a circuit substrate that can reduce Cgd capacitance, sufficiently prevent the influence of Cgd capacitance on applied voltage, and ensure sufficient reliability of the circuit substrate. The present invention also aims a providing a method of manufacturing this circuit substrate, and a display device.

Means for Solving the Problems

The inventors conducted various research on patterns and processes suitable for when an ES process is used, from the perspective of reliability in the production process for oxide semiconductors such as indium gallium zinc oxide, and have discovered how to suitably pattern and remove the oxide semiconductor. It was also discovered that oxide semiconductors can be suitably removed by patterning indium gallium zinc oxide using an etchant for a source metal, or in other words, by also patterning the oxide semiconductor using wet etching when patterning a source metal using wet etching (that is, the simultaneous patterning of both). A configuration was also discovered in which, in circuit substrates obtained by this kind of patterning, one portion of an edge of a removed portion of an oxide semiconductor layer (cutout portion) is located along an edge of an opening (hole) of an etch-stop layer together and closer to the etch-stop layer than an edge of the etch-stop layer, when the main surface of the substrate is planarly viewed, because etching is easy beyond the etch-stop layer in which the oxide semiconductor layer is configured by insulating material. It was discovered that the above problems can be excellently solved by this kind of method of manufacturing a circuit substrate and by the circuit substrate obtained by this method of manufacturing, thereby leading to the present invention.

Namely, one aspect of the present invention may be a circuit substrate that includes: a transparent substrate; a semiconductor element disposed on the transparent substrate, the semiconductor element including a patterned oxide semiconductor layer; an etch-stop layer covering at least a center portion of the oxide semiconductor layer, the etch-stop layer being made of an insulating material and having an opening therein; and a patterned conductive layer covering at least a portion of the etch-stop layer, the patterned conductive layer including a source electrode, a source wiring line, and a drain electrode, wherein a part of an edge of the oxide semiconductor layer is defined by an edge of the opening in the etch-stop layer and is tucked under the edge of the etch-stop layer.

The present invention is described in detail below.

It is preferable that another part of an edge of the oxide semiconductor layer be defined by an edge of the patterned conductive layer and be tucked under the edge of the patterned conductive layer.

It is preferable that the oxide semiconductor layer include indium, gallium, zinc, and oxide.

It is preferable that the patterned conductive layer be a laminate of at least two layers, including a layer having at least one selected from a group having aluminum and copper and a layer having at least one selected from a group having titanium, molybdenum, and chromium, and that the layer having at least one selected from a group having titanium, molybdenum, and chromium be disposed on a surface side of the conductive layer.

It is preferable that the semiconductor element be a thin film transistor.

One aspect of the present invention is a method of manufacturing a circuit substrate constituted of a semiconductor element disposed on a transparent substrate, the method including: forming an island-shaped oxide semiconductor layer on the transparent substrate; forming a patterned etch-stop layer made of an insulating material so as to cover at least a center portion of the island-shaped oxide semiconductor layer; depositing a conductive layer over an entire surface of the transparent substrate including a region over the patterned etch-stop layer; forming a patterned resist on the conductive layer; and etching the conductive layer using the patterned resist as a mask to form a patterned conductive layer from the conductive layer, wherein the patterned conductive layer includes a source electrode, a source wiring line, and a drain electrode, and continuing to etch the island-shaped oxide semiconductor thereunder using the patterned conductive layer and the patterned etch-stop layer as a mask to form a cutout in the island-shaped oxide semiconductor layer.

It is preferable that wet-etching with the same etchant be used in etching the conductive layer and in etching the island-shaped oxide semiconductor layer underneath.

It is preferable that the method of manufacturing a circuit substrate further include, after forming the patterned conductive layer and forming the cutout in the island-shaped oxide semiconductor layer, forming an insulating layer.

One aspect of the present invention may be a circuit substrate made by the method of manufacturing a circuit substrate, the circuit substrate including: the transparent substrate; the semiconductor element disposed on the transparent substrate, the semiconductor element including the patterned oxide semiconductor layer; the etch-stop layer covering at least the center portion of the oxide semiconductor layer, the etch-stop layer having an opening therein; and the patterned conductive layer covering at least a portion of the etch-stop layer, the patterned conductive layer including the source electrode, the source wiring line, and the drain electrode, wherein an edge of the cutout of the oxide semiconductor layer is defined by an edge of the opening in the etch-stop layer and is tucked under the edge of the etch-stop layer.

One aspect of the present invention may be a display device that includes: the circuit substrate; and an opposite substrate coupled to the circuit substrate.

Effects of the Invention

The circuit substrate of the present invention can reduce Cgd capacitance, sufficiently prevent the influence of Cgd capacitance on applied voltage, together with sufficiently ensuring the reliability of the circuit substrate.

DETAILED DESCRIPTION OF EMBODIMENTS

Embodiments are described below, and the present invention is further described in detail with reference to figures, but the present invention is not limited to only these embodiments.

In the specifications, "provided on a member (layer)" refers to "at least one portion thereof provided on a display element side of the member". It is preferable that "an opening of an etch-stop layer" be "a through-hole of an etch-stop layer," and its shape not be particularly limited. Also, the periphery of an opening may be completely enclosed or not completely enclosed by an etch-stop layer. Moreover, as long as a cutout portion of an oxide semiconductor layer is provided corresponding to at least one portion of a region overlapping with neither an etch-stop layer nor the conductive layer, its shape is not particularly limited. Patterning refers to forming a layer or film to be formed by coating the entirety of a substrate deposited with the layer or film to be formed with a photosensitive resist and the like, forming a resist pattern by lithographically exposing the resist and the like, removing the layer or film to be formed and exposed from the resist pattern by etching, and then stripping the resist pattern, for example. High resolution refers to 300 dpi (dots per inch) or above, for example.

Embodiment 1

Figure 1:
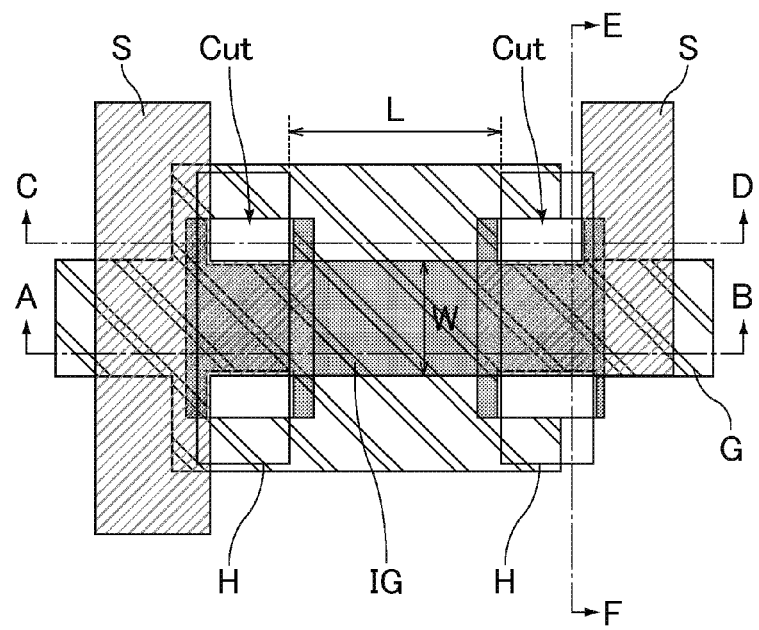
FIG. 1 is a schematic plan view illustrating a configuration of a TFT portion of the circuit substrate of Embodiment 1.

FIG. 1 is a schematic plan view illustrating a configuration of a TFT portion of the circuit substrate of Embodiment 1. The circuit substrate of Embodiment 1 has a semiconductor element arranged on a transparent substrate. The semiconductor element has an oxide semiconductor layer IG of indium gallium zinc oxide and the like. For the circuit substrate, an etch-stop layer is arranged such that at least a center portion of the oxide semiconductor layer is covered. Also, the circuit substrate is provided with a conductive layer S constituted by source electrodes, source wires, and drain electrodes, with at least one portion thereof arranged on the etch-stop layer. The etch-stop layer is provided with openings H. In FIG. 1, the etch-stop layer is the portions that are not rectangular areas surrounded by the openings H.

The circuit substrate has a region overlapping with neither the etch-stop layer nor the conductive layer S when the main surface of the circuit substrate is seen in a plan view. At least one portion of this region is a cutout portion Cut of the oxide semiconductor layer IG.

When the circuit substrate is used in a display device provided with a light source, for example, an electric charge accumulates in the oxide semiconductor and the display reliability worsens due to the influence of the backlight and the like. There were also cases in which the Cgd capacitance increased. Oxide semiconductors of indium gallium zinc oxide and the like are weak to photoreactions; thus, it is desirable that its area be shrunk as much as possible. Meanwhile, as shown by the present embodiment, an oxide semiconductor can be patterned and the Cgd capacitance thereof reduced by removing one portion of the oxide semiconductor. An illustration is omitted from FIG. 1, but as will be evident from a cross-sectional view described hereinafter, only 0.5 μm to 1.5 μm, for example, of one portion of an edge of a cutout portion Cut of the oxide semiconductor layer is located along an edge of an opening H of the etch-stop layer and is closer to the etch-stop layer than an edge of the etch-stop layer itself.

In a plan view of the substrate surface, the edges of the cut-out in the oxide semiconductor layer that are along the opening in the etch stop layer do not need to be completely under the edges of the etch stop layer, but may instead be substantially under these edges Also, as is evident from the figure, only 0.5 μm to 1.5 μm, for example, of other portions of the edges of the cutout portion Cut of the oxide semiconductor layer are located along an edge of the conductive layer S inside the conductive layer S and further away from an edge of the conductive layer S, when the main surface of the substrate is planarly viewed.

It is preferable that the portion located along an edge of the conductive layer S within an edge of the cutout portion Cut of the oxide semiconductor layer be substantially located on inside the conductive layer S away from an edge of the conductive layer S, without the need to be completely located on the side of the conductive layer S beyond an edge of the conductive layer S, when the main surface of the circuit substrate is planarly viewed.

A manufacturing process for the circuit substrate of Embodiment 1 is described in detail below.

Figure 2:
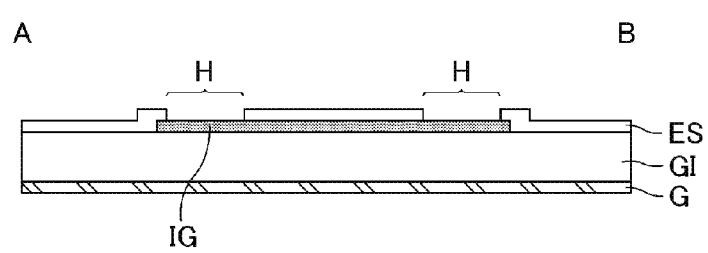
FIG. 2 is a schematic cross-sectional view of a substrate corresponding to a cross-section taken along the line A-B of FIG. 1 after formation of an etch-stop layer.
Figure 3:
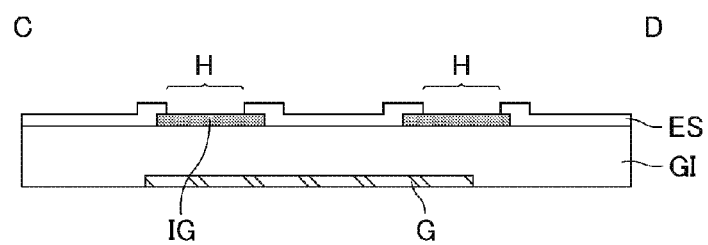
FIG. 3 is a schematic cross-sectional view of a substrate corresponding to a cross-section taken along the line C-D of FIG. 1 after formation of an etch-stop layer.
Figure 4:
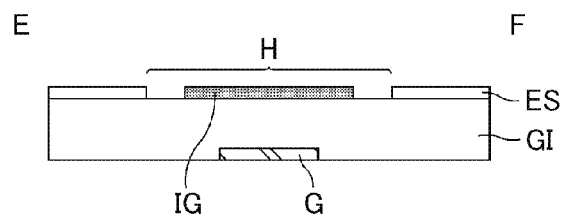
FIG. 4 is a schematic cross-sectional view of a substrate corresponding to a cross-section taken along the line E-F of FIG. 1 after formation of an etch-stop layer.

FIG. 2 is a schematic cross-sectional view of a substrate corresponding to a cross-section taken along the line A-B of FIG. 1 after formation of an etch-stop layer. FIG. 3 is a schematic cross-sectional view of a substrate corresponding to a cross-section taken along the line C-D of FIG. 1 after formation of an etch-stop layer. FIG. 4 is a schematic cross-sectional view of a substrate corresponding to a cross-section taken along the line E-F of FIG. 1 after formation of an etch-stop layer.

First, gate wiring G is formed on a transparent substrate such as a glass substrate. Forming the gate wiring G can be conducted by forming a wiring layer, and then, patterning to a desired shape using photolithography, for example. Specifically, a resist is formed using a mask process and etching is conducted on the wiring layer to form the gate wiring. Next, the resist is removed.

Next, a gate insulation film GI is formed. The gate insulation film GI may be a film of silicon nitride ($SiN_x$), silicon oxide ($SiO_2$), or the like, and can be formed using plasma enhanced chemical vapor deposition (PECVD), for example.

Next, an island-shaped oxide semiconductor layer IG of indium gallium zinc oxide or the like is formed. The island-shaped oxide semiconductor can be formed by depositing an oxide semiconductor IG material with a layer thickness of 10 nm to 300 nm using sputtering, forming the film, and then patterning to a desired shape using photolithography, for example.

Next, the etch-stop layer ES is formed. For the etch-stop layer ES, an insulating film with a film thickness of 50 nm to 300 nm is formed by plasma enhanced CVD (chemical vapor deposition) using an insulating material such as an insulating material containing silicon (silicon oxide film ($SiO_2$), silicon nitride film ($SiN_x$), and silicon nitride oxide film (SiNO), for example) or sputtering, and then, a resist is formed using a mask process, and etching is conducted on the insulating film to form an etch-stop layer provided with an opening H, for example. Also, the etch-stop layer ES is formed such that at least a center portion of the island-shaped oxide semiconductor IG is covered. Next, the resist is removed. The etch-stop layer ES is added in this manner in order to maintain the reliability of the circuit substrate with the produced oxide semiconductor layer IG.

The etch-stop layer ES is provided with two openings H and configured such that a center portion of the oxide semiconductor layer IG is arranged between the two openings H in a plan view, for example.

Figure 5:
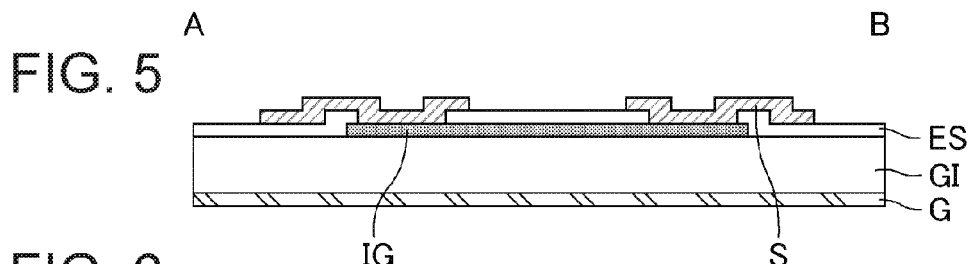
FIG. 5 is a schematic cross-sectional view of a substrate corresponding to a cross-section taken along the line A-B of FIG. 1 after formation of a conductive layer and an oxide semiconductor layer.
Figure 6:
FIG. 6 is a schematic cross-sectional view of a substrate corresponding to a cross-section taken along the line C-D of FIG. 1 after formation of a conductive layer and an oxide semiconductor layer.
Figure 7:
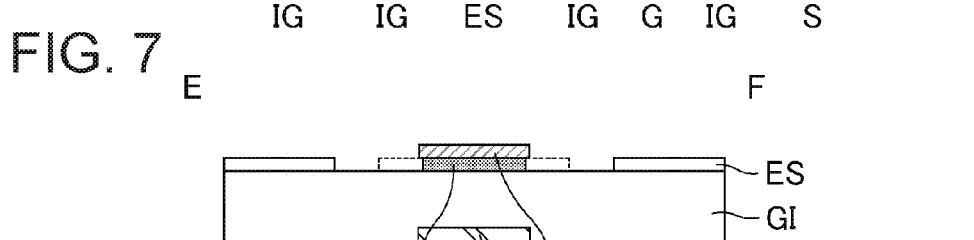
FIG. 7 is a schematic cross-sectional view of a substrate corresponding to a cross-section taken along the line E-F of FIG. 1 after formation of a conductive layer and an oxide semiconductor layer.

FIG. 5 is a schematic cross-sectional view of a substrate corresponding to a cross-section taken along the line A-B of FIG. 1 after formation of a conductive layer and an oxide semiconductor layer. FIG. 6 is a schematic cross-sectional view of a substrate corresponding to a cross-section taken along the line C-D of FIG. 1 after formation of a conductive layer and an oxide semiconductor layer. FIG. 7 is a schematic cross-sectional view of a substrate corresponding to a cross-section taken along the line E-F of FIG. 1 after formation of a conductive layer and an oxide semiconductor layer.

A conductor is deposited on the etch-stop layer ES. A resist is formed using a mask process and etching is conducted on the conductor and the island-shaped oxide semiconductor IG. That is, the conductive layer S constituted of source electrodes, source wiring, and drain electrodes from the conductor is formed and the oxide semiconductor layer IG having a cutout portion is formed by patterning the conductor using wet etching and the like, and during this, also simultaneously patterning the island-shaped oxide semiconductor IG (see FIGS. 6 and 7, for example). In other words, a portion of the island-shaped oxide semiconductor is removed at the same time that the conductor is patterned to form the conductive layer S, which is constituted of source electrodes, source wiring, and drain electrodes. Next, the resist on the substrate is removed.

It is preferable that the formation of the conductive layer and the oxide semiconductor layer be conducted using wet etching. It is also possible to cut the manufacturing cost of the circuit substrate by patterning using wet etching. For an etchant used in wet etching, the same etchants used in wet etching for source metals may be suitably used, and suitable examples include peroxide based etchants (used on source metals being Cu/Ti laminates, referring to the Cu being the top layer and the Ti being the bottom layer/general etchant for Cu, mixed solution of phosphate+nitrate+acetate, used on source metals and the like being Mo/Al/Mo laminate/ general etchant for Al), and the like. Thereby, even when the source metal is a laminate, the source metal can be etched all at once.

Thus, as illustrated in FIG. 1, a portion of an edge of a cutout portion Cut of the oxide semiconductor layer IG is located along an edge of an opening H of the etch-stop layer ES, when the main surface of the circuit substrate is planarly viewed. Also, as illustrated in FIG. 1, one portion of an edge of a cutout portion Cut of the oxide semiconductor layer IG is located closer to the etch-stop layer ES than an edge of the etch-stop layer ES (the oxide semiconductor layer IG is tucked under the etch-stop layer ES), when the main surface of the circuit substrate is planarly viewed. The etch-stop layer ES has an opening H, and there is no oxide semiconductor layer IG, and there is a portion with the conductive layer S.

Moreover, as illustrated in FIG. 1, the other portions of an edge of a cutout portion Cut of the oxide semiconductor layer IG are located along an edge of the conductive layer S when the main surface of the circuit substrate is planarly viewed. Also, as illustrated in FIG. 1, the other portions of an edge of a cutout portion Cut of the oxide semiconductor layer IG are located closer to the conductive layer S than an edge of the conductive layer S (the oxide semiconductor layer IG tucked under the conductive layer S).

A pattern for the oxide semiconductor layer IG may be formed using the etch-stop layer ES and a source, and reduction of Cgd and improvement of the reliability of the circuit substrate may both be achieved by removing a portion of the oxide semiconductor layer IG.

Figure 8:
FIG. 8 is a schematic cross-sectional view of a substrate corresponding to a cross-section taken along the line A-B of FIG. 1 after deposition of a protective film.
Figure 9:
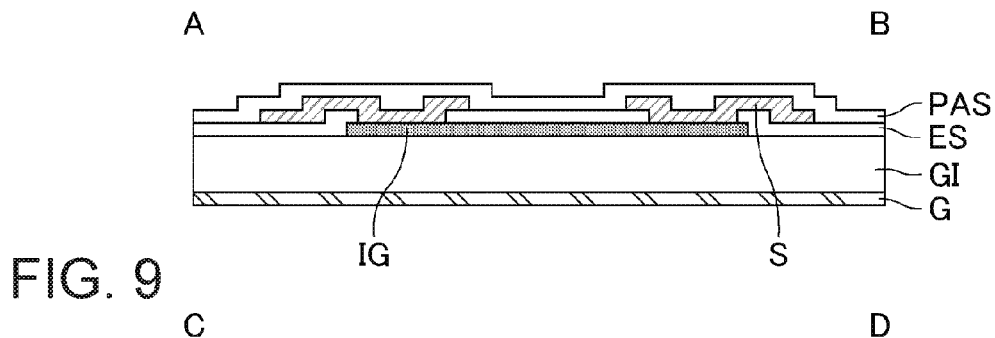
FIG. 9 is a schematic cross-sectional view of a substrate corresponding to a cross-section taken along the line C-D of FIG. 1 after deposition of a protective film.
Figure 9:
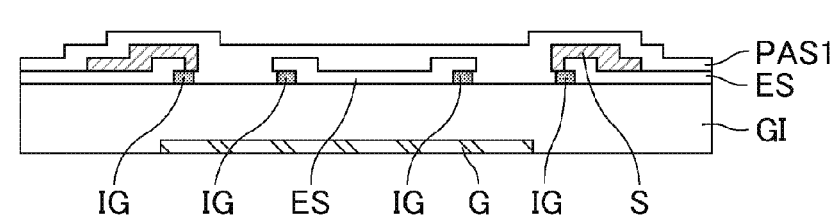
Figure 10:
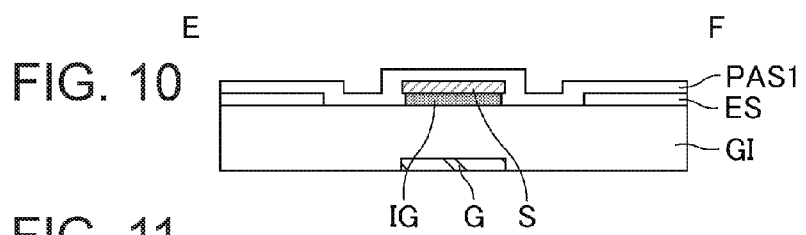
FIG. 10 is a schematic cross-sectional view of a substrate corresponding to a cross-section taken along the line E-F of FIG. 1 after deposition of a protective film.

FIG. 8 is a schematic cross-sectional view of a substrate corresponding to a cross-section taken along the line A-B of FIG. 1 after formation of a protective film deposit. FIG. 9 is a schematic cross-sectional view of a substrate corresponding to a cross-section taken along the line C-D of FIG. 1 after formation of a protective film deposit. FIG. 10 is a schematic cross-sectional view of a substrate corresponding to a cross-section taken along the line E-F of FIG. 1 after formation of a protective film deposit.

A protective film PAS1 is formed. The protective film PAS1 may be a silicon nitride ($SiN_x$) film, silicon oxide ($SiO_2$) film, or the like, and may be formed by plasma enhanced chemical vapor deposition (PECVD) or the like, for example. Note that in FIG. 9 a condition is illustrated in which the oxide semiconductor layer IG is tucker under the etch-stop layer ES, and in FIG. 10 a condition is illustrated in which the oxide semiconductor layer IG is tucked under the conductive layer (source metal) S.

Figure 11:
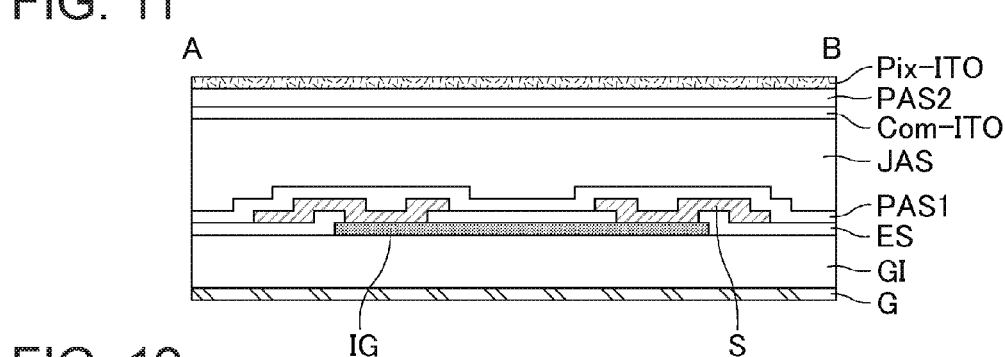
FIG. 11 is a schematic cross-sectional view taken along the line A-B of FIG. 1.
Figure 12:
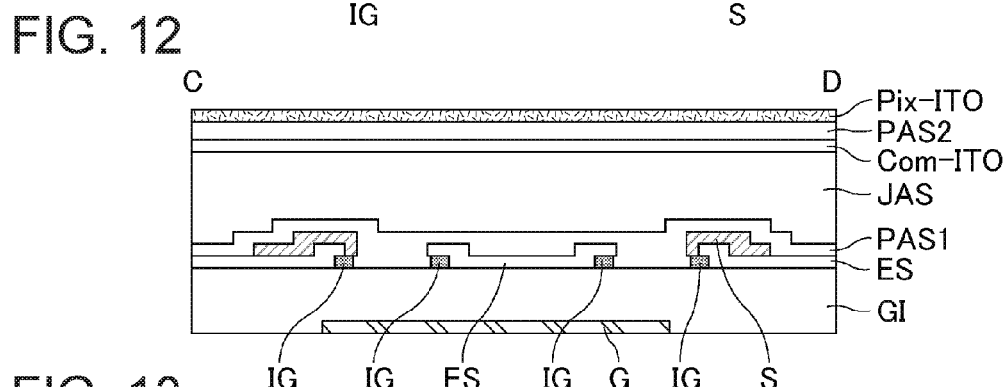
FIG. 12 is a schematic cross-sectional view taken along the line C-D of FIG. 1.
Figure 13:
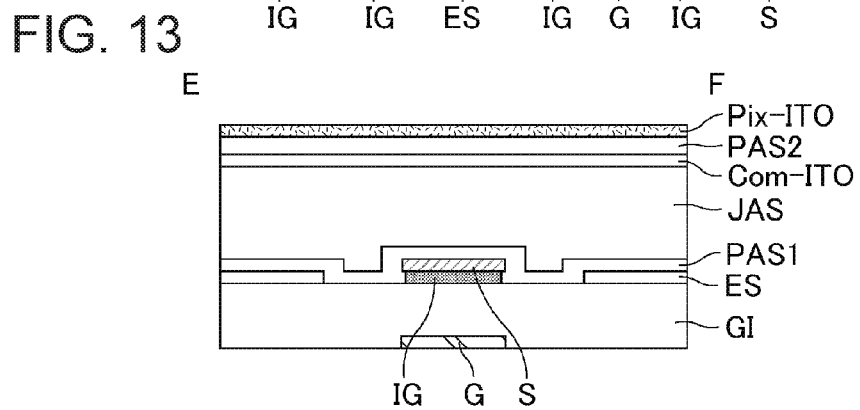
FIG. 13 is a schematic cross-sectional view taken along the line E-F of FIG. 1.

FIG. 11 is a schematic cross-sectional view taken along the line A-B of FIG. 1. FIG. 12 is a schematic cross-sectional view taken along the line C-D of FIG. 1. FIG. 13 is a schematic cross-sectional view taken along the line E-F of FIG. 1.

First, an organic insulating film OI is formed. The organic insulating film OI may be an acrylic resin, and may be formed by spin coating and the like, for example. Note that, as illustrated in FIGS. 11 to 13, the substrate can be planarized by forming the organic insulating film OI.

Next, a common electrode Com is formed on the entire surface of the organic insulating film OI. The common electrode Com can be composed of ITO (Indium Tin Oxide) but may also be composed of other transparent electrodes such as IZO (Indium Zinc Oxide) instead of ITO.

Next, a protective film PAS2 is formed on the entire surface of the common electrode Com. In a similar manner to the protective film PAS1, the protective film PAS2 may be a silicon nitride ($SiN_x$) film or the like, and may be formed by plasma enhanced chemical vapor deposition (PECVD) or the like, for example.

Next, pixel electrodes Pix are formed on the entire surface of the protective film PAS2. The common electrode Com can be composed of ITO (Indium Tin Oxide) but may also be composed of other transparent electrodes such as IZO (Indium Zinc Oxide) instead of ITO.

A portion of the island-shaped oxide semiconductor IG of a region overlapping with neither the etch-stop layer nor the conductive layer S is removed by the formation of the aforementioned conductive layer and the oxide semiconductor layer. Thereby, Cgd can be reduced between the oxide semiconductor layer IG with a cutout portion and the conductive layer.

Members and the like described in the aforementioned manufacturing process of the circuit substrate of Embodiment 1 are described in detail below.

The conductive layer S is configured by a source metal. "Source metal" refers to source wiring and members (source electrodes, drain electrodes, and the like) formed using a process the same as for the source wiring.

"Conductive layer S" refers to a Cu/Ti laminate or a Mo/Al/Mo laminate, but objects containing, besides the above, an aluminum layer, an aluminum alloy layer, a copper layer, and/or a copper alloy layer may be suitably used.

The aluminum layer is a layer substantially configured by only aluminum metal. In the manufacturing of wiring containing an aluminum layer, there are cases in which trace amounts of impurity elements are contained in the aluminum layer, because elements also scatter from other metal materials, interlayer insulating films, and the like in contact with the aluminum layer. Also, the aluminum alloy layer may contain aluminum as necessary, and may be configured by containing other metallic elements and nonmetallic elements such as silicon. Examples of the metallic elements added to the aluminum alloy include nickel, iron, cobalt, and the like. It is more preferable to further add boron, neodymium, lanthanum, and the like as an additional element to the aluminum alloy.

The copper layer is a layer substantially configured by only copper. For the copper layer, there are cases in which trace amounts of impurity elements are contained therein, because elements also scatter from other metal materials, interlayer insulating films, and the like in contact with the copper layer. The copper alloy layer may contain copper as necessary, and may be further configured by containing other metallic elements and nonmetallic elements such as carbon and silicon. Examples of the metallic elements added to the copper alloy include magnesium, manganese, and the like.

Other metallic elements may be suitably used as the conductive layer S.

The wires are signal wires transmitting an electric signal, power supply wires for supplying power, wires configuring a circuit, wires for applying an electric field (applying an electric field to a TFT gate, for example), and the like. Also, when applying the circuit substrate of the present invention to a liquid crystal display device, the circuit substrate of the present invention may be further provided with auxiliary capacitance wiring for forming auxiliary capacitance used for retaining voltage applied to the liquid crystals.

It is preferable that the semiconductor element be a thin film transistor (TFT). When using the TFT on an active matrix substrate for a display device, for example, the source wiring is electrically in contact with pixel electrodes, which the display pixels configure, via source electrodes and drain electrodes, which the TFT configures.

For the transparent substrate, various substrates may be used without being particularly limited. Substrates such as single crystal semiconductor substrates, oxide single crystal substrates, metal substrates, glass substrates, quartz substrates, and resin substrates, for example, may be used. In the case of a single crystal semiconductor substrate or a conductive substrate such as a metal substrate, for example, it is preferable that these substrates be used by providing an insulating film and the like thereon.

For the aforementioned gate insulation film, etch-stop layer, protective film, organic insulating film, and the like, there may be 1 or more layers.

It is preferable that the pixel electrodes be a transparent conductive film. Normally, Indium Tin Oxide, Indium Zinc Oxide, and the like are used as a transparent conductive film and thus may be suitably used in the circuit substrate of the present invention.

The circuit substrate according to Embodiment 1 may be disassembled and shapes of the liquid crystal cells and the like may be verified by observation with a microscope such as an optical microscope, scanning transmission electron microscope (STEM), and scanning electron microscope (SEM).

The circuit substrate of Embodiment 1, as mentioned above, can sufficiently make the reliability of a circuit substrate favorable and sufficiently reduce Cgd capacitance, because the etch-stop layer is provided. Also, the circuit substrate of Embodiment 1 may be the easiest to manufacture. Particularly for high resolution display devices, the circuit substrate of Embodiment 1 is suitable for cutting ΔVd (pull-in voltage).

The circuit substrate of Embodiment 1 was bonded with a substrate opposed thereto, and a liquid crystal display panel was manufactured by injecting liquid crystals. Also, this became a liquid crystal display device by providing the liquid crystal display panel with a polarizing plate and other members thereof.

Embodiment 2

Figure 14:
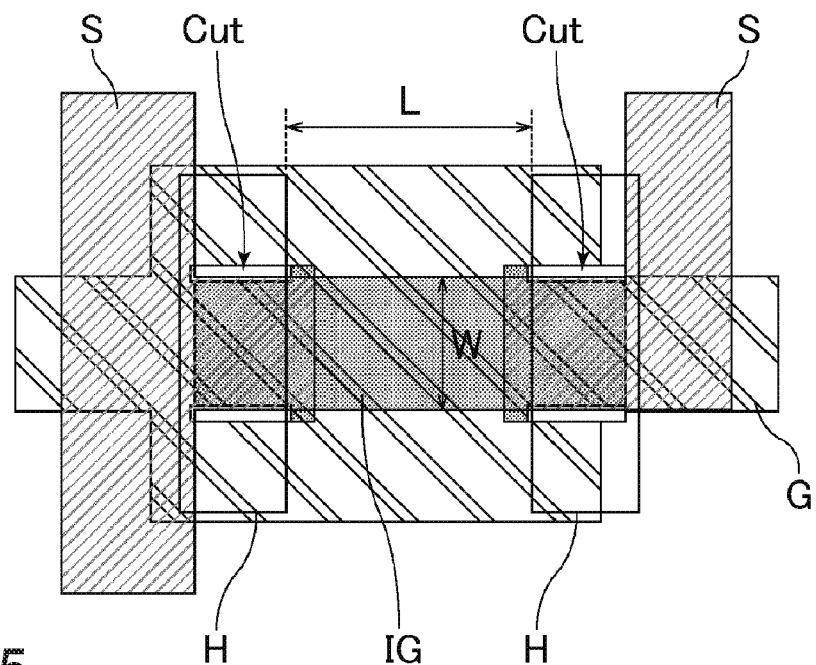
FIG. 14 is a schematic plan view illustrating a configuration of a TFT portion of the circuit substrate of Embodiment 2.

FIG. 14 is a schematic plan view illustrating a configuration of a TFT portion of the circuit substrate of Embodiment 2.

The shape of the oxide semiconductor IG according to Embodiment 2 differs from the shape of the oxide semiconductor conductor IG according to Embodiment 1. For the oxide semiconductors IG according to Embodiments 1 and 2, both the widths W of the center portions are the same as the widths of the gate wiring G, and the width of both ends are larger than the widths W of the center portions. Here, for the width of both ends, the width for Embodiment 2 is smaller than the width for Embodiment 1. Also, in Embodiment 2, a portion of the left end of the oxide semiconductor layer IG within FIG. 14 does not overlap with the conductive layer S (source wiring) extending in a vertical direction. The other configurations of Embodiment 2 are the same as the aforementioned configurations of Embodiment 1. For the circuit substrate of Embodiment 2, manufacturing is not as easy as with Embodiment 1, but Cgd capacitance can be reduced more.

Embodiment 3

Figure 15:
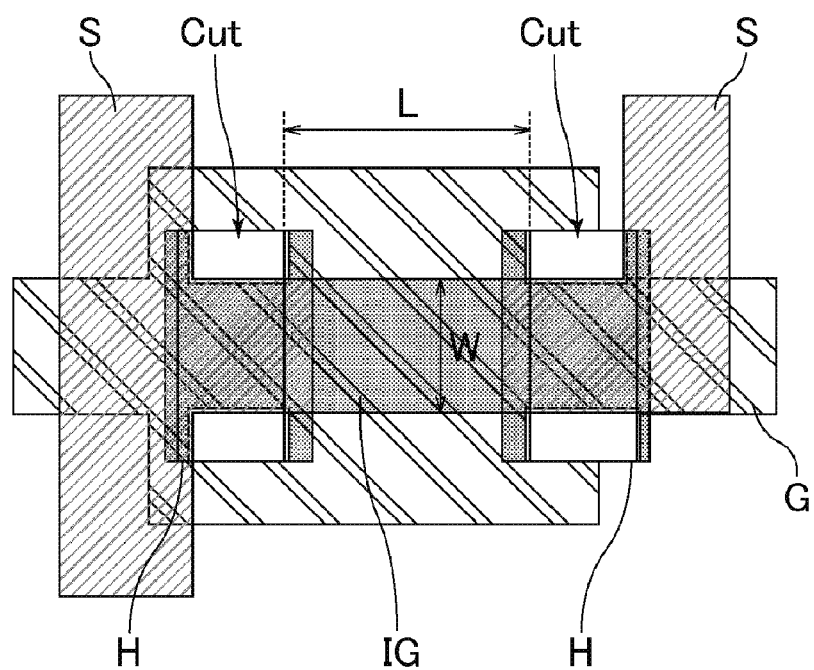
FIG. 15 is a schematic plan view illustrating a configuration of a TFT portion of the circuit substrate of Embodiment 3.

FIG. 15 is a schematic plan view illustrating a configuration of a TFT portion of the circuit substrate of Embodiment 3. The openings H of the etch-stop layer according to Embodiment 3 are smaller in a vertical direction on FIG. 15 than the openings H of the etch-stop layer according to Embodiment 1. The other configurations of Embodiment 3 are the same as the aforementioned configurations of Embodiment 1. For the circuit substrate of Embodiment 3, manufacturing is not as easy as with Embodiment 2, but Cgd capacitance can be reduced more.

Embodiment 4

Figure 16:
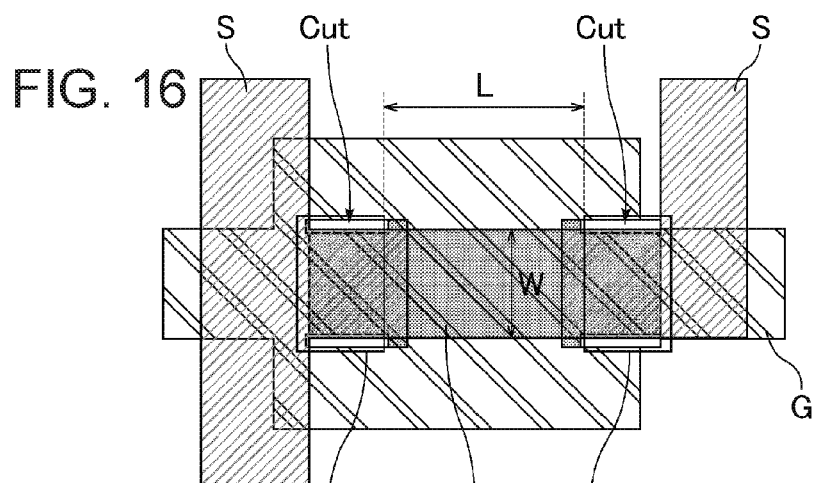
FIG. 16 is a schematic plan view illustrating a configuration of a TFT portion of the circuit substrate of Embodiment 4.

FIG. 16 is a schematic plan view illustrating a configuration of a TFT portion of the circuit substrate of Embodiment 4. The openings H of the etch-stop layer according to Embodiment 4 are smaller in a vertical direction on FIG. 15 than the openings H of the etch-stop layer according to Embodiment 2. The other configurations of Embodiment 4 are the same as the aforementioned configurations of Embodiment 1. For the circuit substrate of Embodiment 4, manufacturing is not as easy as with Embodiment 3, but Cgd capacitance can be reduced more.

A structure of a TFT portion that can suitably apply the present invention is described in detail below. The configurations besides the ones specified below are the same as the aforementioned configurations for Embodiment 1.

Modification Example of Embodiment 1

Figure 17:
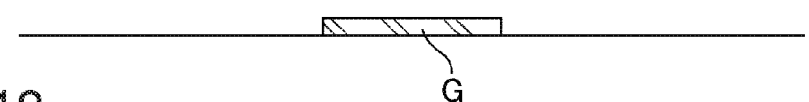
FIG. 17 is a schematic cross-sectional view illustrating a configuration after formation of a gate corresponding to a TFT portion of a circuit substrate of a modification example of Embodiment 1.

FIG. 17 is a schematic cross-sectional view illustrating a configuration after formation of a gate corresponding to a TFT portion of a circuit substrate of a modification example of Embodiment 1. First, gate wiring G was formed on a transparent substrate such as a glass substrate. It is preferable that the gate wiring G be a Cu/Ti laminate or a TiN/Ti/Al laminate, for example.

Figure 18:
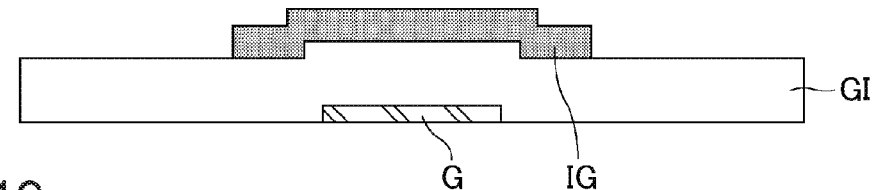
FIG. 18 is a schematic cross-sectional view illustrating a configuration after formation of an oxide semiconductor layer corresponding to a TFT portion of a circuit substrate of a modification example of Embodiment 1.

FIG. 18 is a schematic cross-sectional view illustrating a configuration after formation of an oxide semiconductor layer corresponding to a TFT portion of a circuit substrate of a modification example of Embodiment 1. A gate insulation film GI was further formed from the substrate illustrated in FIG. 17. Next, an island-shaped oxide semiconductor layer IG of indium gallium zinc oxide and the like was formed.

Figure 19:
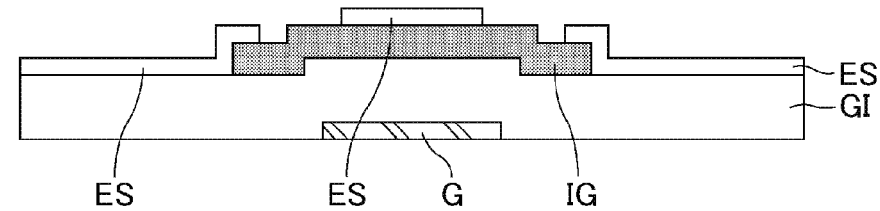
FIG. 19 is a schematic cross-sectional view illustrating a configuration after formation of an etch-stop layer corresponding to a TFT portion of a circuit substrate of a modification example of Embodiment 1.

FIG. 19 is a schematic cross-sectional view illustrating a configuration after formation of an etch-stop layer corresponding to a TFT portion of a circuit substrate of a modification example of Embodiment 1. An etch-stop layer ES was further formed from the substrate illustrated in FIG. 18.

Figure 20:
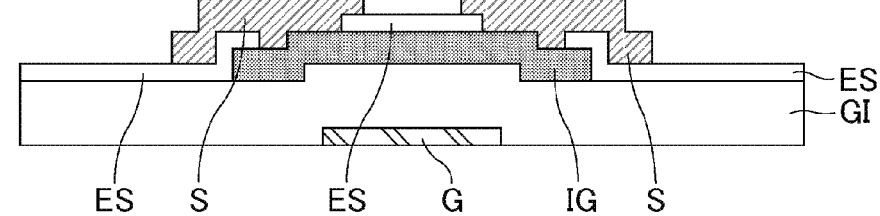
FIG. 20 is a schematic cross-sectional view illustrating a configuration after formation of a conductive layer corresponding to a TFT portion of a circuit substrate of a modification example of Embodiment 1.

FIG. 20 is a schematic cross-sectional view illustrating a configuration after formation of a conductive layer corresponding to a TFT portion of a circuit substrate of a modification example of Embodiment 1. A conductive layer S was further formed on the etch-stop layer ES from the substrate illustrated in FIG. 19. It is preferable that the conductive layer S be a Cu/Ti laminate or a MoN/Al/Mon laminate, for example. Liquid medicine that can etch the conductive layer S and the oxide semiconductor layer IG was used as an etchant for wet etching.

Figure 21:
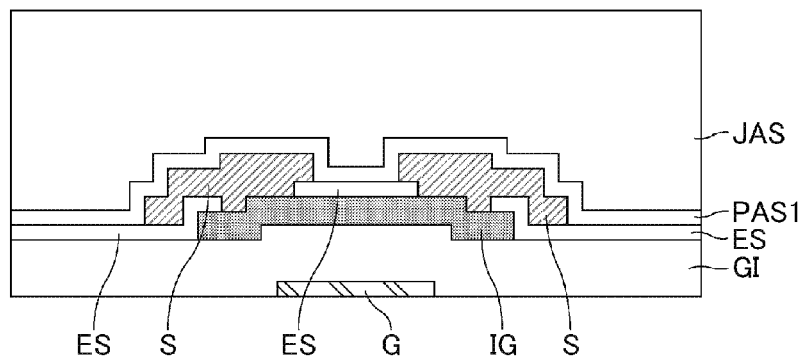
FIG. 21 is a schematic cross-sectional view illustrating a configuration after formation of protective film and organic insulation film corresponding to a TFT portion of a circuit substrate of a modification example of Embodiment 1.

FIG. 21 is a schematic cross-sectional view illustrating a configuration after formation of protective film and organic insulation film corresponding to a TFT portion of a circuit substrate of a modification example of Embodiment 1. A protective film PAS1 was further formed from the substrate illustrated in FIG. 20. Next, an organic insulating film OI was formed.

Figure 22:
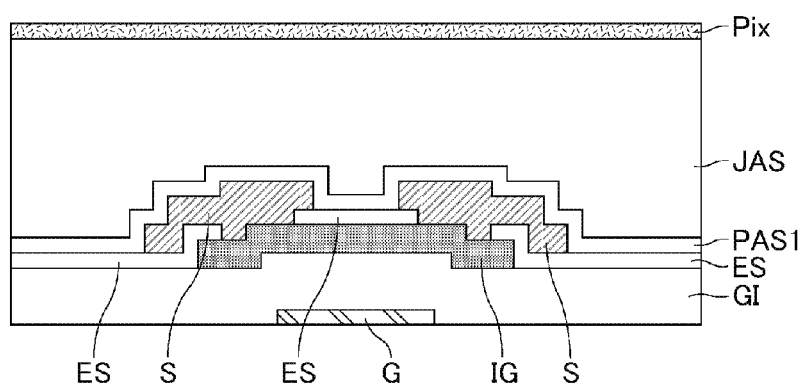
FIG. 22 is a schematic cross-sectional view illustrating a configuration after formation of pixel electrodes corresponding to a TFT portion of a circuit substrate of a modification example of Embodiment 1.

FIG. 22 is a schematic cross-sectional view illustrating a configuration after formation of pixel electrodes corresponding to a TFT portion of a circuit substrate of a modification example of Embodiment 1. Pixel electrodes Pix were further formed on the entire surface of the organic insulating film OI from the substrate illustrated in FIG. 21. The pixel electrodes Pix can be composed of ITO (Indium Tin Oxide) but may also be composed of other transparent electrodes such as IZO (Indium Zinc Oxide) instead of ITO.

The modification example of the circuit substrate of Embodiment 1 may be suitably used in liquid crystal display devices in a vertical alignment (VA) mode.

Another Modification Example of Embodiment 1

The other modification example of Embodiment 1 is the same as the aforementioned modification example of Embodiment 1 up to the formation of the organic insulating film. The steps after formation of the organic insulating film are described below. Note that the configurations besides the ones specified for each member (materials and the like) are the same as the aforementioned configurations.

Figure 23:
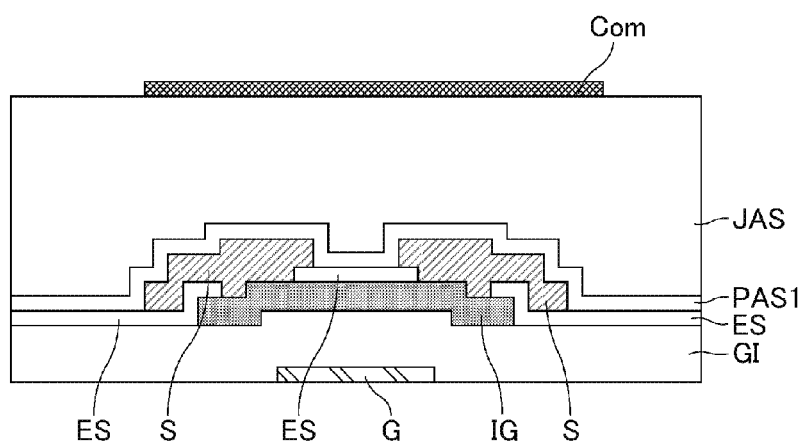
FIG. 23 is a schematic cross-sectional view illustrating a configuration after formation of a common electrode corresponding to a TFT portion of a circuit substrate of another modification example of Embodiment 1.

FIG. 23 is a schematic cross-sectional view illustrating a configuration after formation of common electrodes corresponding to a TFT portion of a circuit substrate of the other modification example of Embodiment 1. Electrode materials were deposited on the entire surface of the organic insulating film OI and patterning was conducted to form common electrodes Com.

Figure 24:
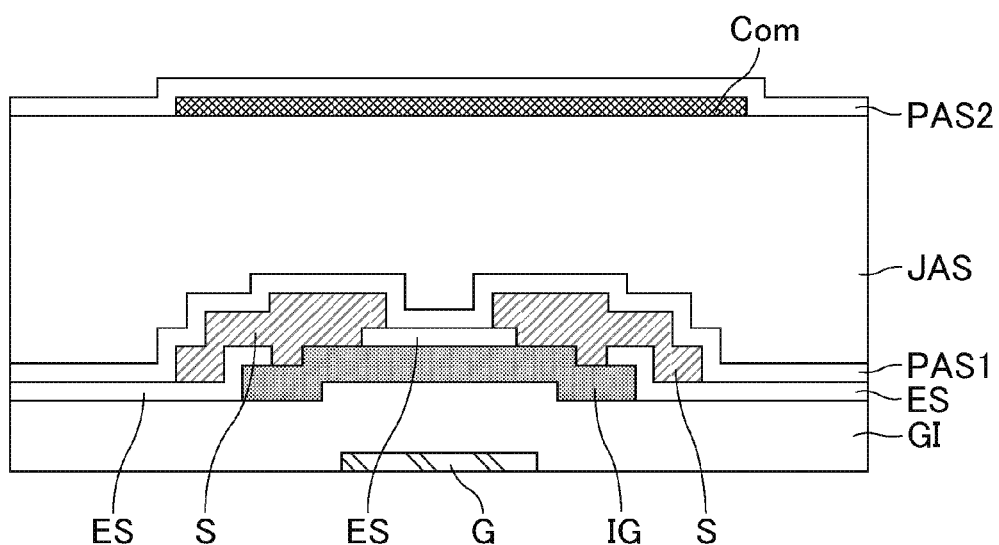
FIG. 24 is a schematic cross-sectional view illustrating a configuration after formation of protective film corresponding to a TFT portion of a circuit substrate of the other modification example of Embodiment 1.

FIG. 24 is a schematic cross-sectional view illustrating a configuration after formation of protective film corresponding to a TFT portion of a circuit substrate of the other modification example of Embodiment 1. A protective film PAS2 was further formed on the common electrodes Com from the substrate illustrated in FIG. 23.

Figure 25:
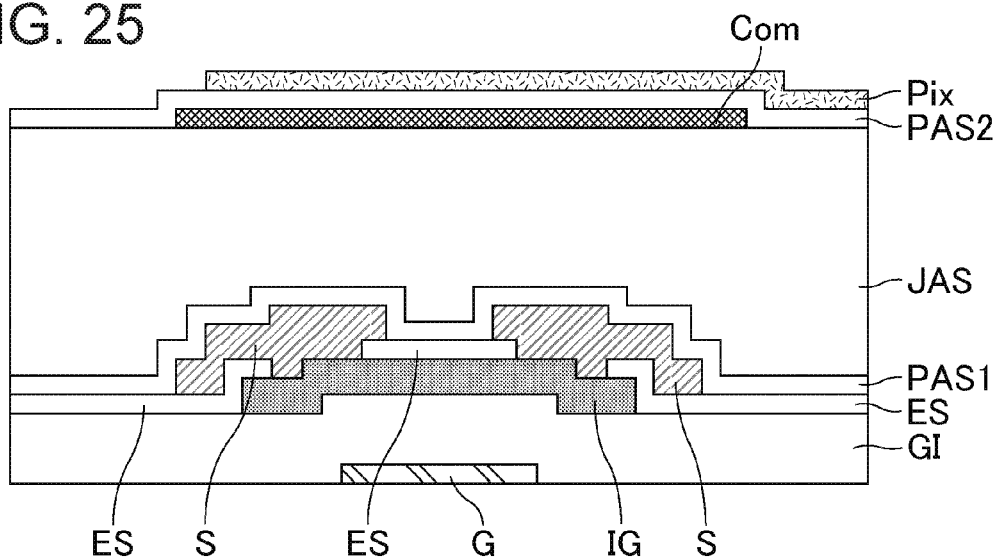
FIG. 25 is a schematic cross-sectional view illustrating a configuration after formation of pixel electrodes corresponding to a TFT portion of a circuit substrate of the other modification example of Embodiment 1.

FIG. 25 is a schematic cross-sectional view illustrating a configuration after formation of pixel electrodes corresponding to a TFT portion of a circuit substrate of the other modification example of Embodiment 1. From the substrate illustrated in FIG. 24, electrode materials were further deposited on the entire surface of the protective film PAS2 and patterning was conducted to form pixel electrodes Pix.

The other modification example of the circuit substrate of Embodiment 1 may be suitably used in liquid crystal display devices in a fringe field switching (FFS) mode.

Comparison Example 1

Figure 26:
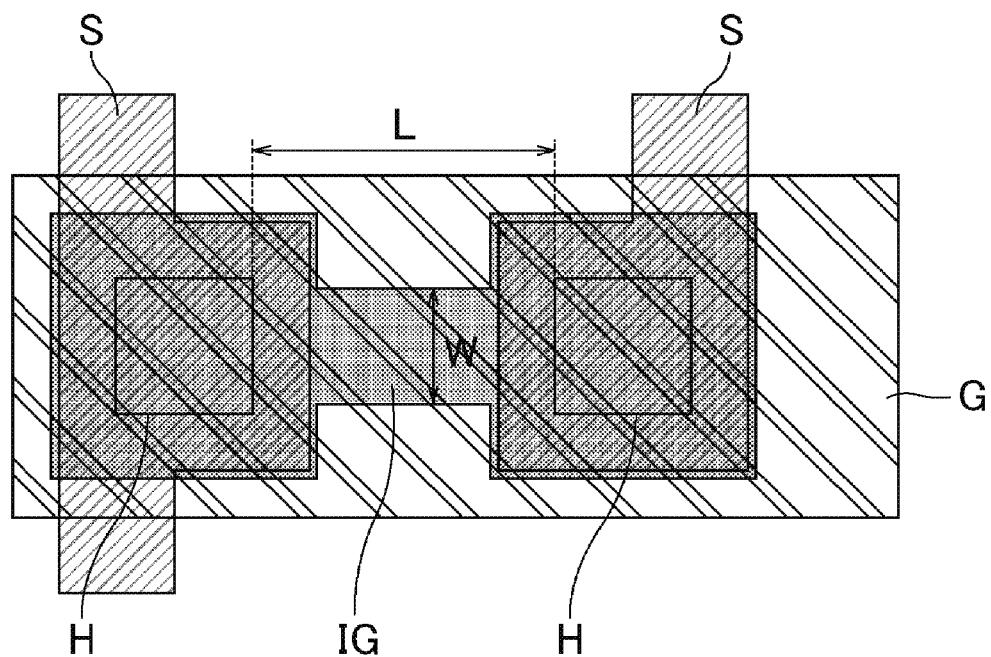
FIG. 26 is a schematic plan view illustrating a configuration of a TFT portion of the circuit substrate of Comparison Example 1.

FIG. 26 is a schematic plan view illustrating a configuration of a TFT portion of the circuit substrate of Comparison Example 1.

For the circuit substrate illustrated in FIG. 26, the entirety of the openings H of the etch-stop layer ES is located on the inner side of the conductive layer S, when the main surface of the substrate is planarly viewed. In other words, for the circuit substrate illustrated in FIG. 26, there are no regions overlapping with neither the etch-stop layer ES nor the conductive layer S. Because of this, in Comparison Example 1, the oxide semiconductor layer IG is not patterned during wet etching of the conductive layer S. Accordingly, Cgd capacitance cannot be sufficiently reduced. Note that other configurations of the circuit substrate of Comparison Example 1 and manufacturing processes are the same as those aforementioned in Embodiment 1.

Other Embodiments

The semiconductor elements of the aforementioned embodiments refer to 3-terminal elements such as transistors, but it is possible to use 2-terminal elements and the like such as diodes as conductor elements.

As an oxide semiconductor layer, an oxide semiconductor configured by In, Si, Zn, and O, an oxide semiconductor configured by In, Al, Zn, and O, an oxide semiconductor configured by Sn, Si, Zn, and O, an oxide semiconductor configured by Sn, Al, Zn, and O, an oxide semiconductor configured by Sn, Ga, Zn, and O, an oxide semiconductor configured by Ga, Si, Zn, and O, an oxide semiconductor configured by Ga, Al, Zn, and O, an oxide semiconductor configured by In, Cu, Zn, and O, an oxide semiconductor configured by Sn, Cu, Zn, and O, an oxide semiconductor configured by Zn and O, an oxide semiconductor configured by In and O, and the like may be used besides indium gallium zinc oxide.

For the aforementioned embodiments, a gate wiring G, gate insulating film GI, and oxide semiconductor layer IG are formed in this order on a transparent substrate, and a back gate thin film transistor in which the conductive layer S is in contact with the oxide semiconductor layer IG is formed, but the present invention may also be suitably applied to top gate thin film transistors.

Each circuit substrate of the embodiments is suitably used in display devices such as liquid crystal display devices, organic EL display devices, and inorganic EL display devices as an active matrix substrate, but is not limited to a circuit substrate for a display device.

The technical features described in each embodiment can be mutually combined, and can form a new technical feature by being combined. In Embodiment 1, a configuration is illustrated in which common electrodes and pixel electrodes are provided on a circuit substrate, but as is illustrated in the modification example of Embodiment 1, a configuration may be set in which only pixel electrodes are provided and common electrodes are not provided, for example.

DESCRIPTION OF REFERENCE CHARACTERS

Com common electrode
Cut cutout portion of oxide semiconductor layer
ES etch-stop layer
G gate wiring
GI gate insulation film
H opening of etch-stop layer
IG island-shaped oxide semiconductor or oxide semiconductor layer
OI organic insulating film
L distance between two openings provided on etch-stop layer
PAS1, PAS2 protective film
Pix pixel electrodes
S conductive layer
W width of central portion of oxide semiconductor layer

What is claimed is:
1. A method of manufacturing a circuit substrate comprising a semiconductor element disposed on a transparent substrate, said method comprising:
   forming a gate wiring on the transparent substrate;
   forming a gate insulating film on the gate wiring;
   forming an island-shaped oxide semiconductor layer on the gate insulating film, overlapping the gate wiring on the transparent substrate;
   forming a patterned etch-stop layer made of an insulating material so as to cover a center portion of the island-shaped oxide semiconductor layer and expose a prescribed area of the island-shaped oxide semiconductor layer;
   depositing a conductive layer over an entire surface of the transparent substrate including the patterned etch-stop layer;
   forming a patterned resist on the conductive layer; and
   etching the conductive layer using the patterned resist as a mask to form a patterned conductive layer from the conductive layer, wherein the patterned conductive layer includes a source electrode, a source wiring line, and a drain electrode, and covers and electrically contacts a middle portion of the exposed prescribed area of the island-shaped oxide semiconductor layer, leaving respective portions of the prescribed area of the island-shaped oxide semiconductor layer on respective sides of said middle portion uncovered and exposed in a plan view, the step of etching continuing to etch and completely remove the exposed respective portions of the prescribed area of the island-shaped oxide semiconductor layer thereunder using the patterned conductive layer and the patterned etch-stop layer as a mask to form cutouts on respective sides of said middle portion in the island-shaped oxide semiconductor layer in the plan view.

2. The method of manufacturing a circuit substrate according to claim 1, wherein wet-etching with the same etchant is used in etching the conductive layer and in etching the island-shaped oxide semiconductor layer underneath.

3. The method of manufacturing a circuit substrate according to claim 1, further comprising, after forming the patterned conductive layer and forming the cutouts in the island-shaped oxide semiconductor layer, forming an insulating layer.

4. The method of manufacturing a circuit substrate according to claim 1,
   wherein the circuit substrate comprises:
      the transparent substrate;
      the semiconductor element disposed on the transparent substrate, said semiconductor element including the patterned oxide semiconductor layer;
      the etch-stop layer covering the center portion of the oxide semiconductor layer, the etch-stop layer having an opening therein; and
      the patterned conductive layer covering at least a portion of the etch-stop layer, the patterned conductive layer including the source electrode, the source wiring line, and the drain electrode, and
   wherein an edge of each of the cutouts of the oxide semiconductor layer is defined by an edge of the opening in the etch-stop layer and is tucked under said edge of the etch-stop layer.

5. The method of manufacturing a circuit substrate according to claim 1, wherein the island-shaped oxide semiconductor layer comprises indium, gallium, zinc, and oxide.

* * * * *